United States Patent
Yamamoto

(10) Patent No.: US 7,519,934 B2
(45) Date of Patent: Apr. 14, 2009

(54) SYSTEM, METHOD AND PROGRAM FOR DESIGNING A SEMICONDUCTOR INTEGRATED CIRCUIT USING INTERSECTION RATIOS WITH STANDARD CELLS

(75) Inventor: Yuji Yamamoto, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 309 days.

(21) Appl. No.: 11/360,110

(22) Filed: Feb. 22, 2006

(65) Prior Publication Data
US 2006/0206849 A1 Sep. 14, 2006

(30) Foreign Application Priority Data
Mar. 11, 2005 (JP) ............................ P2005-069788

(51) Int. Cl.
*G06F 17/50* (2006.01)
(52) U.S. Cl. ...................................................... 716/12
(58) Field of Classification Search .................. 716/2, 716/9–10, 12–14
See application file for complete search history.

(56) References Cited

U.S. PATENT DOCUMENTS 6,592,815 B1 * 7/2003 Zimmer ........................ 422/58
6,598,206 B2 * 7/2003 Darden et al. .................. 716/2

FOREIGN PATENT DOCUMENTS

JP 2002-508593 3/2002
JP 2004-055873 2/2004

* cited by examiner

*Primary Examiner*—Stacy A Whitmore
(74) *Attorney, Agent, or Firm*—DLA Piper LLP (US)

(57) ABSTRACT

A system for designing a semiconductor integrated circuit includes an extraction module for extracting through wiring tracks linearly passing through each of area priority cells and yield priority cells, a layout data generator for generating second layout data from first layout data by replacing the area priority cells with the yield priority cells; and a calculator for calculating a ratio of the number of intersections at which through wiring cannot be laid to the number of all of the intersections defined in the semiconductor integrated circuit.

12 Claims, 13 Drawing Sheets

SYSTEM, METHOD AND PROGRAM FOR DESIGNING A SEMICONDUCTOR INTEGRATED CIRCUIT USING INTERSECTION RATIOS WITH STANDARD CELLS

CROSS REFERENCE TO RELATED APPLICATIONS AND INCORPORATION BY REFERENCE

This application is based upon and claims the benefit of priority from prior Japanese Patent Application P2005-069788 filed on Mar. 11, 2005; the entire contents of which are incorporated by reference herein.

BACKGROUND OF THE INVENTION

1. Field of the Invention

The present invention relates to a design system, a design method and a computer program product for designing a layout of a semiconductor integrated circuit, particularly relates to the design system, the design method and the computer program product for designing a layout of the semiconductor integrated circuit using standard cells.

2. Description of the Related Art

Along with miniaturization of semiconductor integrated circuits, serious problems have arisen due to reductions in semiconductor integrated circuit yield. According to one method for improving yield, two vias connecting between wiring arranged in different metalization layers of standard cells (hereafter simply referred to as 'cells') to be used in a semiconductor integrated circuit are deployed at each connection. As a result, fracture defects of the cells caused by bad connections between metalization layers decreases. A cell designed with increased yield, as the main priority, by arranging a plurality of vias at each connection is referred to as a 'yield priority cell'.

However, the yield priority cell is often larger than a cell not manufactured by the above method for improving yield. By deploying a plurality of vias at respective connections, the ratio of connections in the metalization layers increases. As a result, regions for deployment of wiring within the cell decrease, thereby reducing connectibility. Here, 'connectibility' denotes flexibility in wiring in the semiconductor integrated circuit. Furthermore, an increase in cell size may increase the chip size.

The following method prevents an increase in the chip size. First, automatic cell arrangement is carried out using cells designed with area reduction as the main priority (hereafter referred to as 'area priority cells'). The area priority cells are then replaced with yield priority cells having the same functionality and characteristics as the area priority cells. In a case where the size of the yield priority cells is larger than the size of the area priority cells, the area priority cells are replaced with the yield priority cells, using regions that do not include any cells.

The above method does not decrease connectibility due to use of the yield priority cells. Therefore, wiring in the semiconductor integrated circuit, after cell replacement, may be impossible. According to a method taking connectibility after cell replacement into consideration, detailed routes for wiring are designed after a rough arrangement of wiring, and a degree of wiring congestion is estimated base on the results of the calculation. However, rough arrangement of wiring is carried out by a heuristic algorithm based on an enormous amount of information including information of wiring routes, information of cells existing in candidate places for wiring routes, and the like. Therefore, rough arrangement of wiring is time consuming.

SUMMARY OF THE INVENTION

An aspect of the present invention inheres in a system for designing a semiconductor integrated circuit. The system includes an extraction module configured to extract through wiring tracks that linearly pass through horizontally each of area priority cells, which are included in a first layout data and designed to reduce area thereof, and yield priority cells designed to increase yield from horizontal wiring tracks; a selection module configured to select a cell from among a plurality of the area priority cells to be used in the first layout data; a replacement module configured to replace the selected area priority cell with the yield priority cell that has the same functionality and characteristics as the replaced area priority cell in order to generate second layout data from the first layout data; an investigation module configured to investigate an overlap between the yield priority cell which replaced the area priority cell and a cell adjacent to the yield priority cell; a cell move module configured to move at least one of the yield priority cell and an adjacent cell to resolve the overlap when the overlap occurs; and a calculator configured to calculate a ratio of the number of intersections between the horizontal wiring tracks and vertical wiring tracks at which through wiring cannot be laid to the number of all of the intersections defined in the semiconductor integrated circuit, based on the second layout data and information of the through wiring tracks.

Another aspect of the present invention inheres is a computer implemented method for designing a semiconductor integrated circuit. The method includes extracting through wiring tracks that linearly pass through horizontally each of area priority cells, which are included in a first layout data and designed to reduce the area thereof, and yield priority cells designed to increase yield from horizontal wiring tracks; generating second layout data from the first layout data by replacing the area priority cells with the yield priority cells; investigating an overlap between the yield priority cell which replaced the area priority cell and a cell adjacent to the yield priority cell; moving at least one of the yield priority cell and an adjacent cell to resolve the overlap when the overlap occurs; and calculating a ratio of the number of intersections between the horizontal wiring tracks and vertical wiring tracks at which through wiring cannot be laid to the number of all of the intersections defined in the semiconductor integrated circuit, based on the second layout data and information of the through wiring tracks.

Still another aspect of the present invention inheres in a computer program product to be executed by a computer for designing a semiconductor integrated circuit. The computer program product includes instructions configured to extract through wiring tracks that linearly pass through horizontally each of area priority cells, which are included in a first layout data and designed to reduce the area thereof, and yield priority cells designed to increase yield from horizontal wiring tracks; instructions configured to generate second layout data from the first layout data by replacing the area priority cells with the yield priority cells; and instructions configured to calculate a ratio of the number of intersections between the horizontal wiring tracks and vertical wiring tracks at which through wiring cannot be laid to the number of all of the intersections defined in the semiconductor integrated circuit, based on the second layout data and information of the through wiring tracks.

DETAILED DESCRIPTION OF THE INVENTION

Figure 1:
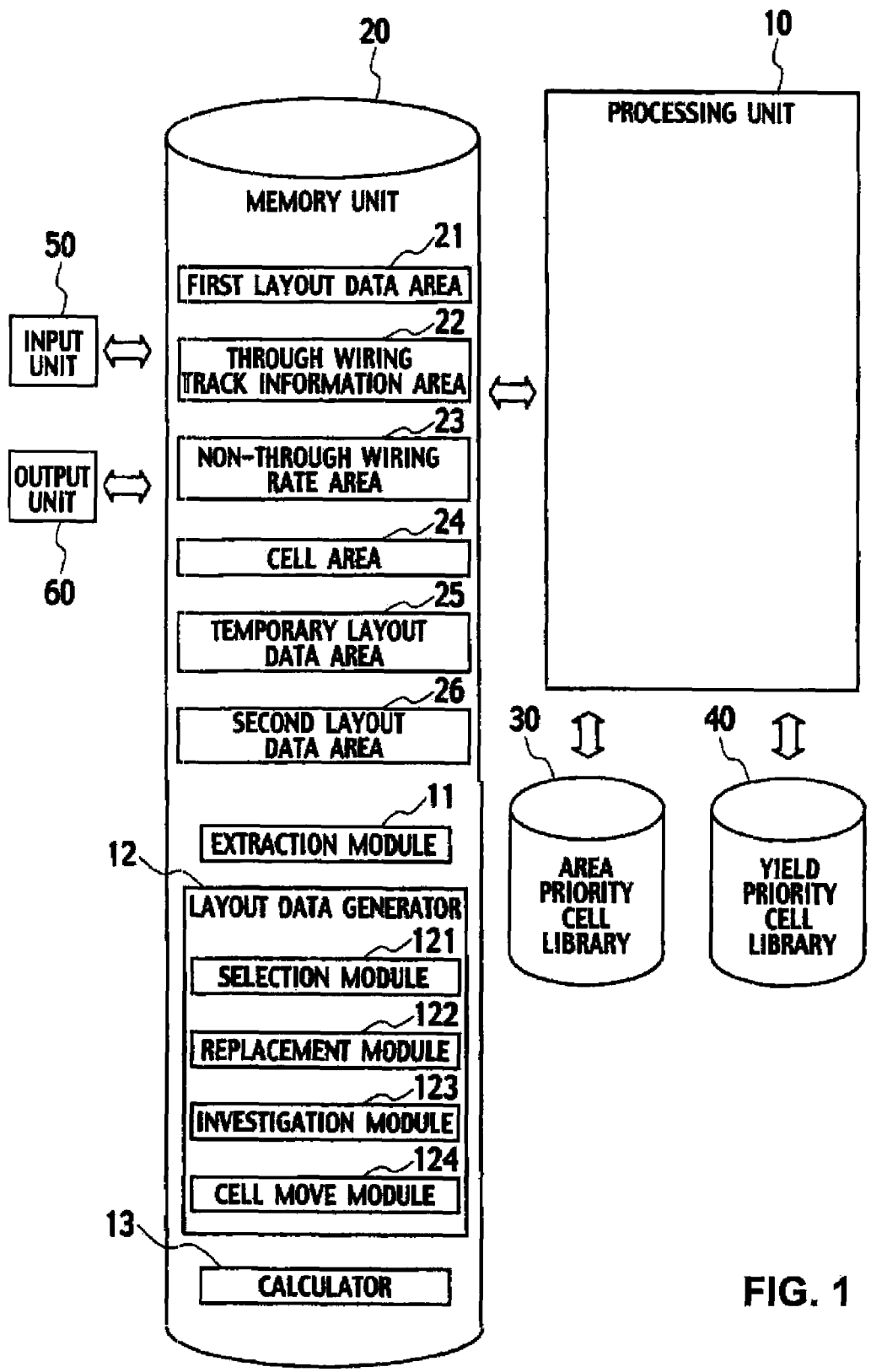
FIG. 1 shows a schematic structure of a system for designing a semiconductor integrated circuit according to a first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

In the following descriptions, numerous specific details are set forth such as specific signal values, etc., to provide a thorough understanding of the present invention. However, it will be obvious to those skilled in the art that the present invention may be practiced without such specific details. In other instances, well-known circuits have been shown in block diagram form in order not to obscure the present invention in unnecessary detail.

First Embodiment

As shown in FIG. 1, a semiconductor integrated circuit design system, according to a first embodiment of the present invention, includes an extraction module 11, a layout data generator 12, and a calculator 13. The extraction module 11 extracts through wiring tracks that linearly pass through horizontally area priority cells, which are included in the first layout data and designed with a priority to reduce the cell areas, and through wiring tracks that linearly pass through horizontally yield priority cells, which are designed with a priority to increase yield from horizontal wiring tracks. The layout data generator 12 generates the second layout data from the first layout data by replacing area priority cells included in the first layout data with yield priority cells. Based on the second layout data and information of through wiring tracks, the calculator 13 calculates the ratio of the number of intersections between the horizontal wiring tracks and the vertical wiring tracks at which through wiring cannot be laid to the number of all of the intersections defined in the semiconductor integrated circuit. 'Through wiring' refers to wiring linearly passing through an area priority cell or a yield priority cell, connecting the cells to each other. The ratio calculated by the calculator 13 is hereafter referred to as 'non-through wiring rate'.

As shown in FIG. 1, a processing unit 10 may perform processing in association with various system modules including the extraction module 11, the layout data generator 12, and the calculator 13. The layout data generator 12 includes a selection module 121, a replacement module 122, an investigation module 123, and a cell move module 124. The selection module 121 selects a cell from among a plurality of cells to be used in the semiconductor integrated circuit. The replacement module 122 replaces an area priority cell with a yield priority cell having the same functionality and characteristics as the area priority cell. The investigation module 123 investigates whether or not there is an overlapping of the yield priority cell replaced for the area priority cell and an adjacent cell to the yield priority cell. The cell move module 124 moves at least either the yield priority cell or the adjacent cell so as to resolve overlapping of cells when the yield priority cell and the adjacent cell overlap.

The design system shown in FIG. 1 further includes a memory 20, an area priority cell library 30, a yield priority cell library 40, an input unit 50, and an output unit 60. The memory 20 includes a first layout data area 21, a through wiring track information area 22, a non-through wiring rate area 23, a cell area 24, a temporary layout data area 25, and a second layout data area 26.

The first layout data area 21 stores the first layout data for the semiconductor integrated circuit. The through wiring track information area 22 stores the information of through wiring tracks extracted by the extraction module 11. The non-through wiring rate area 23 stores a non-through wiring rate calculated by the calculator 13. The cell area 24 stores cell information of a cell selected from among a plurality of cells used in the semiconductor integrated circuit. The cell information includes cell sizes, positions and sizes of terminal regions in the cells, and the like. 'Terminal regions' are regions electrically connecting the cells to wiring. The temporary layout data area 25 stores temporary layout data after cell replacement by the replacement module 122 and temporary layout data after a cell has been moved by the cell move module 124. The second layout data area 26 stores the second layout data after replacement as determined by the layout data generator 12.

The area priority cell library 30 stores cell information of a plurality of area priority cells, respectively. The yield priority cell library 40 stores cell information of a plurality of yield priority cells, respectively.

The input unit 50 includes a keyboard, a mouse pointer, a light pen, and a flexible disk unit or other equivalent elements. A person responsible for generating layout data uses the input unit 50 to designate input/output data. Moreover, setting an output data format via the input unit 50 is possible, and executing design and inputting an instruction for stopping that execution is also possible.

The output unit 60 includes a display and a printer, which display a result of designing, or a recording unit, which stores information in a computer readable recording medium. A 'computer readable recording medium' refers to a medium such as an external storage unit for a computer, a semiconductor memory, a magnetic disk, or an optical disk, which may store electronic data. More specifically, a 'computer readable recording medium' may be a flexible disk, a compact disk read only memory (CD-ROM), or a magneto-optics (MO) disk.

Figure 2:
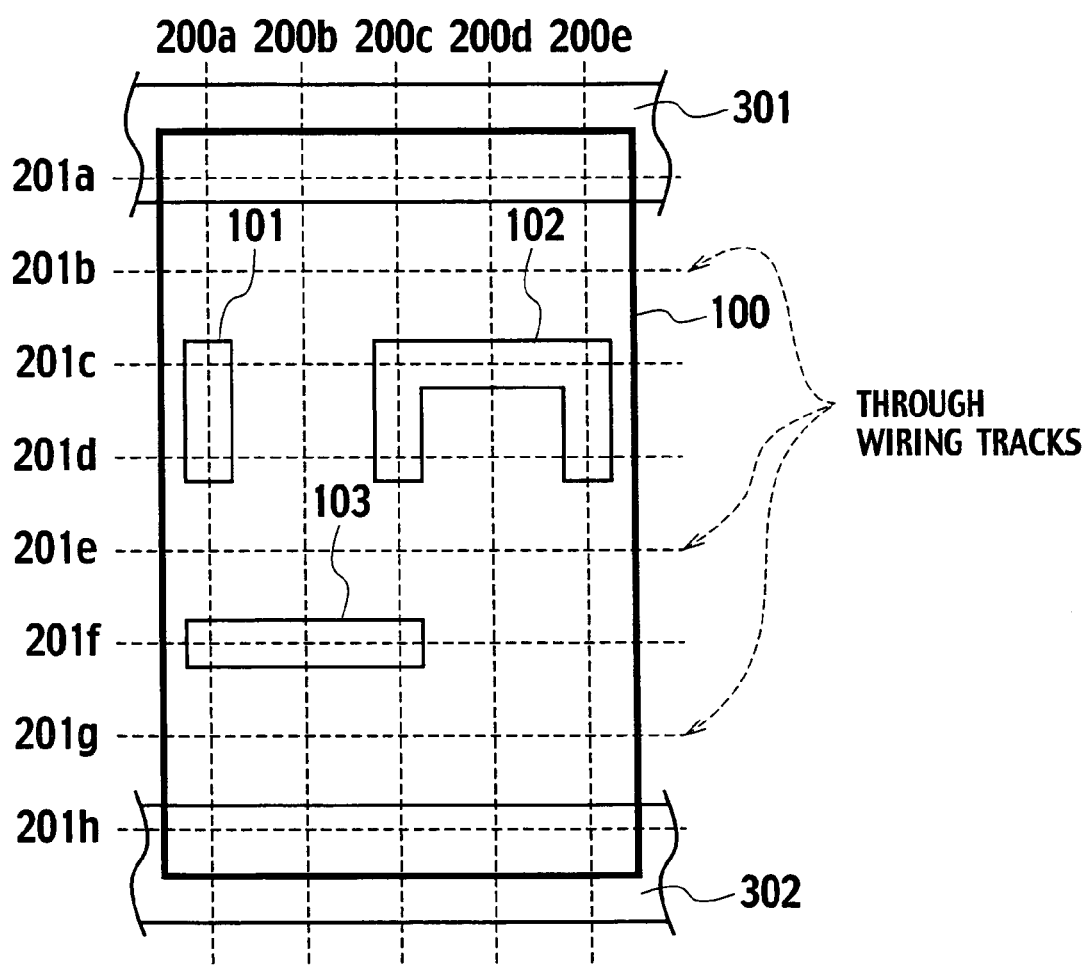
FIG. 2 shows an example of a cell used in a semiconductor integrated circuit.

A method for extracting through wiring tracks is described with reference to FIG. 2. A cell 100 shown in FIG. 2 is an exemplary cell to be used in the semiconductor integrated circuit. A through wiring track is a wiring track on which through wiring linearly passing through the cell may be deployed. In other words, a through wiring track is a horizontal wiring track which does not overlap with a terminal region or a power supply line region in the cell.

Power supply line regions 301 and 302 are regions in which power supply lines for the semiconductor integrated circuit are to be deployed. Terminal regions 101 through 103 are regions for the cell 100. Wiring tracks 201a through 201h are horizontal wiring tracks passing through the cell 100 running in parallel. Wiring tracks 200a through 200e are vertical wiring tracks passing through the cell 100 running in parallel. The directions of the horizontal wiring tracks and the vertical wiring tracks may be selected arbitrarily. For example, the direction of the horizontal wiring and the direction of the vertical wiring may be replaced by rotating the cell 100 at an angle of ninety degrees.

As shown in FIG. 2, the wiring tracks 201b, 201e, and 201g do not overlap with the terminal regions 101 through 103 and the power supply line regions 301 and 302 in the cell 100. Therefore, the wiring arranged on the wiring tracks 201b, 201e, and 201g linearly pass through the cell 100. Then, the extraction module 11 extracts the wiring tracks 201b, 201e, and 201g as the 'through wiring tracks' of the cell 100.

Figure 3:
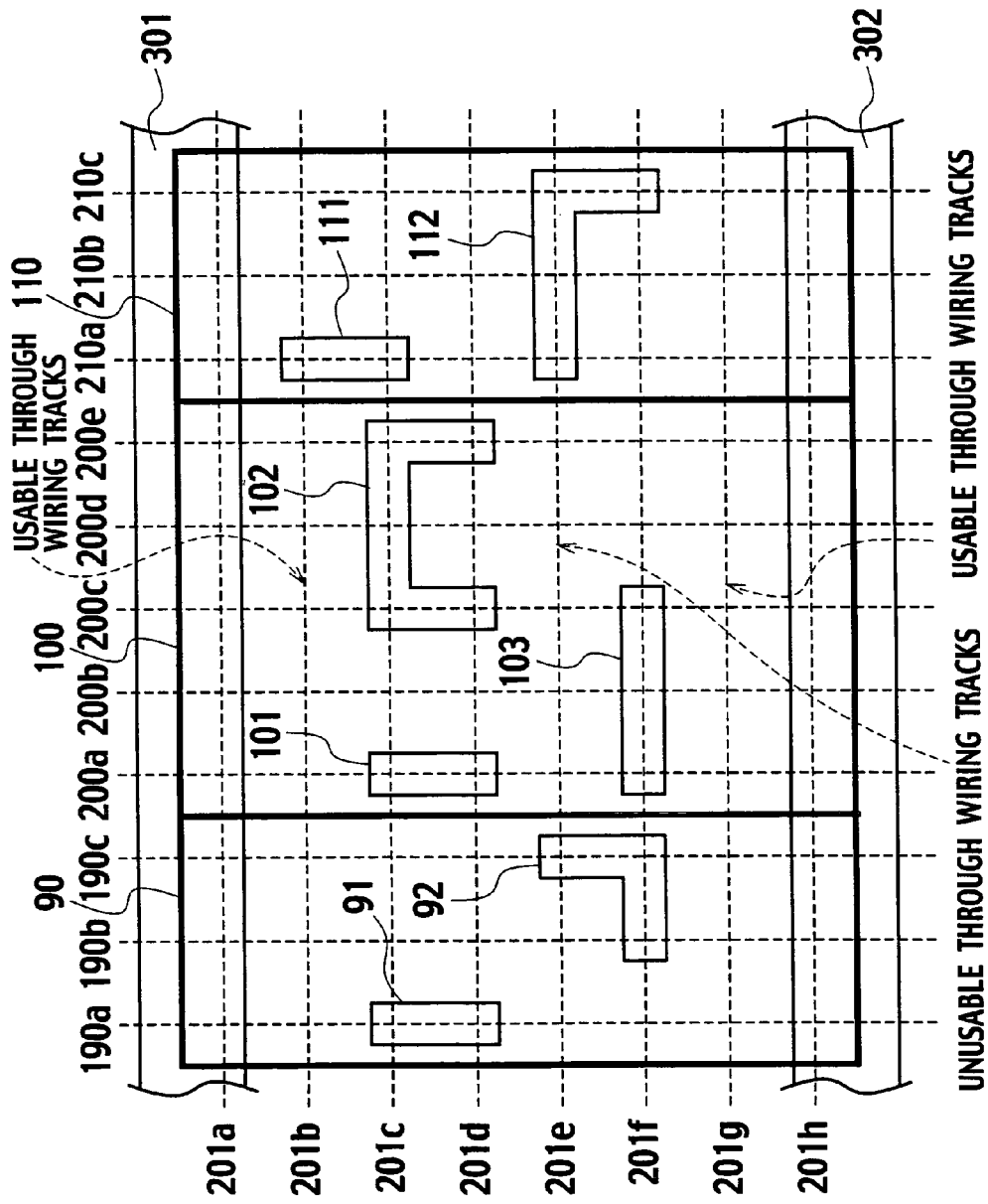
FIG. 3 shows an example of a cell used in a semiconductor integrated circuit.

A method for calculating non-through wiring tracks is described with reference to the exemplary layout shown in FIG. 3. In the layout shown in FIG. 3, cells 90 and 110 are arranged adjacent to the cell 100 of FIG. 2. As shown in FIG. 3, the cell 90 has terminal regions 91 and 92. The cell 110 has terminal regions 111 and 112. The wiring tracks 201a through 201h and wiring tracks 190a through 190c pass through the cell 90. The wiring tracks 201a through 201h and wiring tracks 210a through 210c pass through the cell 110.

As described above, the through wiring tracks of the cell 100 are the wiring tracks 201b, 201e, and 201g. However, the wiring track 201e overlaps with the terminal region 92 of the cell 90 and the terminal region 112 of the cell 110. Accordingly, there is substantially no possibility of signal wiring being deployed on the wiring track 201e. Therefore, the wiring track 201e is regarded as a through wiring track on which through wiring is not deployed. A through wiring track, on which through wiring cannot be deployed due to being affected by the positions and the like of the terminal regions of an adjacent cell, is hereafter referred to as an 'unusable through wiring track'. The wiring track 201g does not overlap with the terminal regions of the cell 90 and the cell 110. However, the wiring track 201b overlaps with the terminal region 111 of the cell 110 but does not overlap with the terminal regions of the cell 90. Therefore, the wiring tracks 201b and 201g are regarded as through wiring tracks on which through wiring can be deployed. A through wiring track, on which through wiring can be deployed, is hereafter referred to as a 'usable through wiring track'. In other words, a usable through wiring track is a through wiring track linearly, consecutively passing through a plurality of adjacent cells. A non-usable through wiring track is a through wiring track non-linearly, non-consecutively passing through mutually adjacent cells.

As shown in FIG. 3, eight horizontal wiring tracks and five vertical wiring tracks pass through the cell 100. Accordingly, focusing on intersections of the horizontal wiring tracks and the vertical wiring tracks (hereafter referred to as 'wiring points'), forty wiring points are found in the cell 100. However, wiring points other than wiring points on the usable through wiring tracks are regarded as unusable wiring points with substantially no possibility of through wiring deployment. In other words, unusable wiring points are intersections where unusable through wiring tracks pass through. The calculator 13 calculates the non-through wiring rate of the semiconductor integrated circuit by dividing the total number of unusable wiring points in all of the cells by the number of wiring points in all of the cells. In the case where the ratio of terminal regions increases due to replacement of the area priority cells with the yield priority cells, the non-through wiring rate of the semiconductor integrated circuit generally increases. The greater the non-through wiring rate, the lower the degree of freedom in deploying wiring and the lower the connectibility.

The method for calculating a non-through wiring rate described above is merely an example. For example, the non-through wiring rate may be calculated with the wiring track 201e also as a usable through wiring track taking only the terminal regions of the cell 100 into consideration. In other words, design time may be reduced by providing all the through wiring tracks extracted from only the information of terminal regions in the respective cells as usable wiring tracks without consideration of the terminal regions of the adjacent cells.

Figure 4:
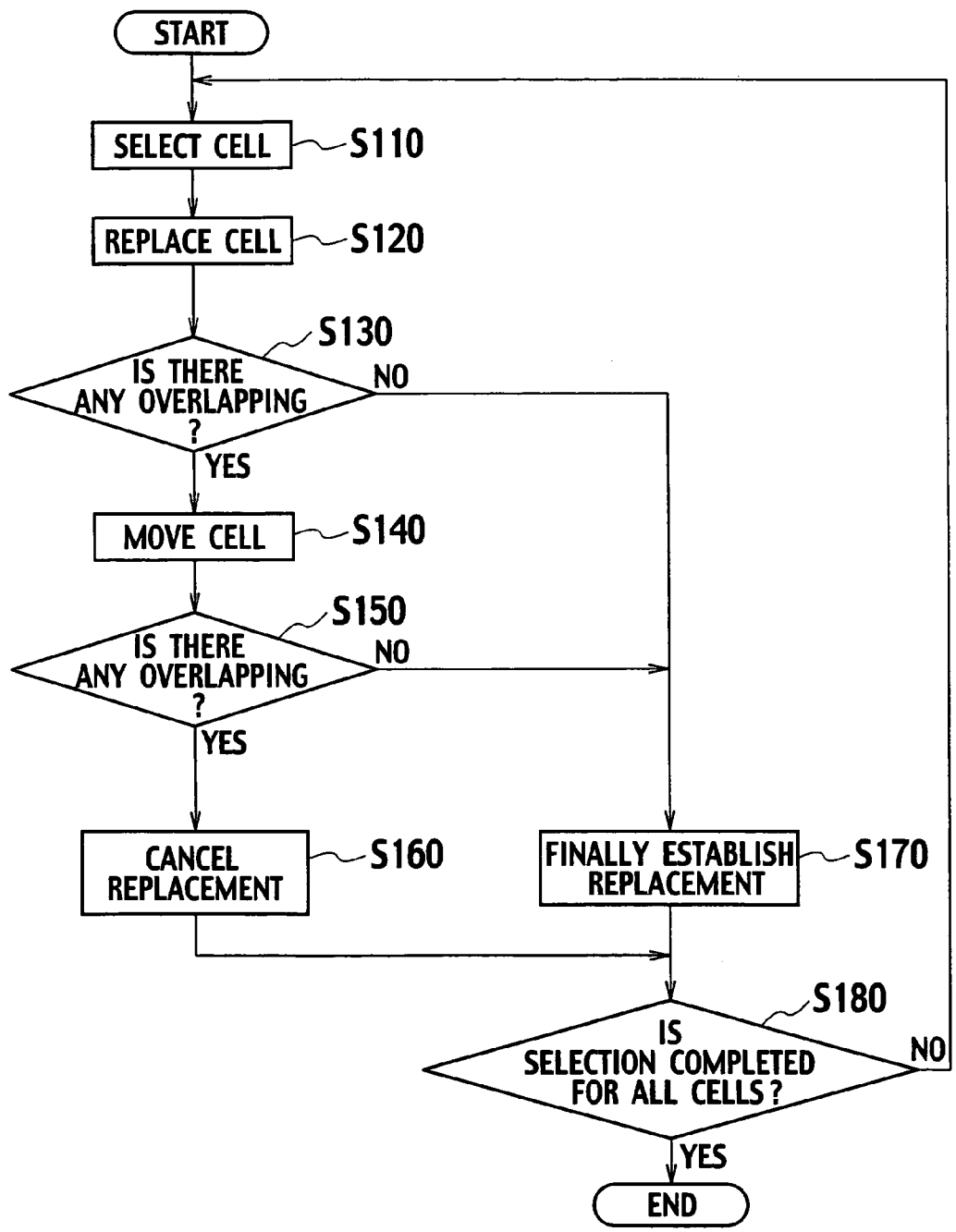
FIG. 4 is a flowchart explaining a method for replacing cells according to the first embodiment of the present invention.

Next, a method for replacing the area priority cells with the yield priority cells by the layout data generator 12 is described with reference to the flowchart shown in FIG. 4.

In step S110, the selection module 121 reads first layout data from the first layout data area 21. The selection module 121 selects an area priority cell from among a plurality of area priority cells included in the first layout data. Cell information of the selected area priority cell is stored in the cell area 24.

In step S120, the replacement module 122 reads the cell information of the area priority cell from the cell area 24. The replacement module 122 reads a yield priority cell, from the yield priority cell library 40, having the same functionality and characteristics as the read area priority cell. The replacement module 122 generates temporary layout data by replacing the read area priority cell included in the first layout data with the yield priority cell. The generated temporary layout data is stored in the temporary layout data area 25.

In step S130, the investigation module 123 reads the temporary layout data from the temporary layout data area 25. The investigation module 123 investigates whether or not there is an overlap of the yield priority cell replacing the area priority cell in the step S120 with a cell adjacent to the yield priority cell, based on the temporary layout data. When there is no overlapping of the cells, processing proceeds to step S170, finally establishing cell replacement. The temporary layout data is stored as the first layout data in the first layout data area 21. Processing then proceeds to step S180. When the cells are overlapping, processing proceeds to step S140.

In the step S140, the cell move module 124 moves either one or both of the yield priority cell and the adjacent cell to resolve the overlapping of the cells. For example, the adjacent cell is moved to a region in which there are no cells in the periphery of the yield priority cell and the adjacent cell. The generated temporary layout data after the cell is moved is stored in the temporary layout data area 25.

In step S150, the investigation module 123 reads the temporary layout data from the temporary layout data area 25. Based on the temporary layout data, the investigation module 123 determines whether or not the overlapping of the yield priority cell and the adjacent cell has been resolved. When there is no overlapping of the cells, processing proceeds to the step S170, and the cell replacement and movement in the respective steps S120 and S140 are finally established. The temporary layout data is stored as the first layout data in the first layout data area 21. Processing then proceeds to the step S180. On the other hand, when there is overlapping, processing proceeds to step S160, and the cell replacement and movement in the respective steps S120 and S140 is canceled. Processing then proceeds to the step S180.

In the step S180, the selection module 121 determines whether or not all of the area priority cells have been selected. If there are any unselected area priority cells, processing returns to the step S110. If all the area priority cells have been selected, the first layout data stored in the first layout data area 21 is stored as second layout data in the second layout data area 26, thereby completing the processing.

Figure 5:
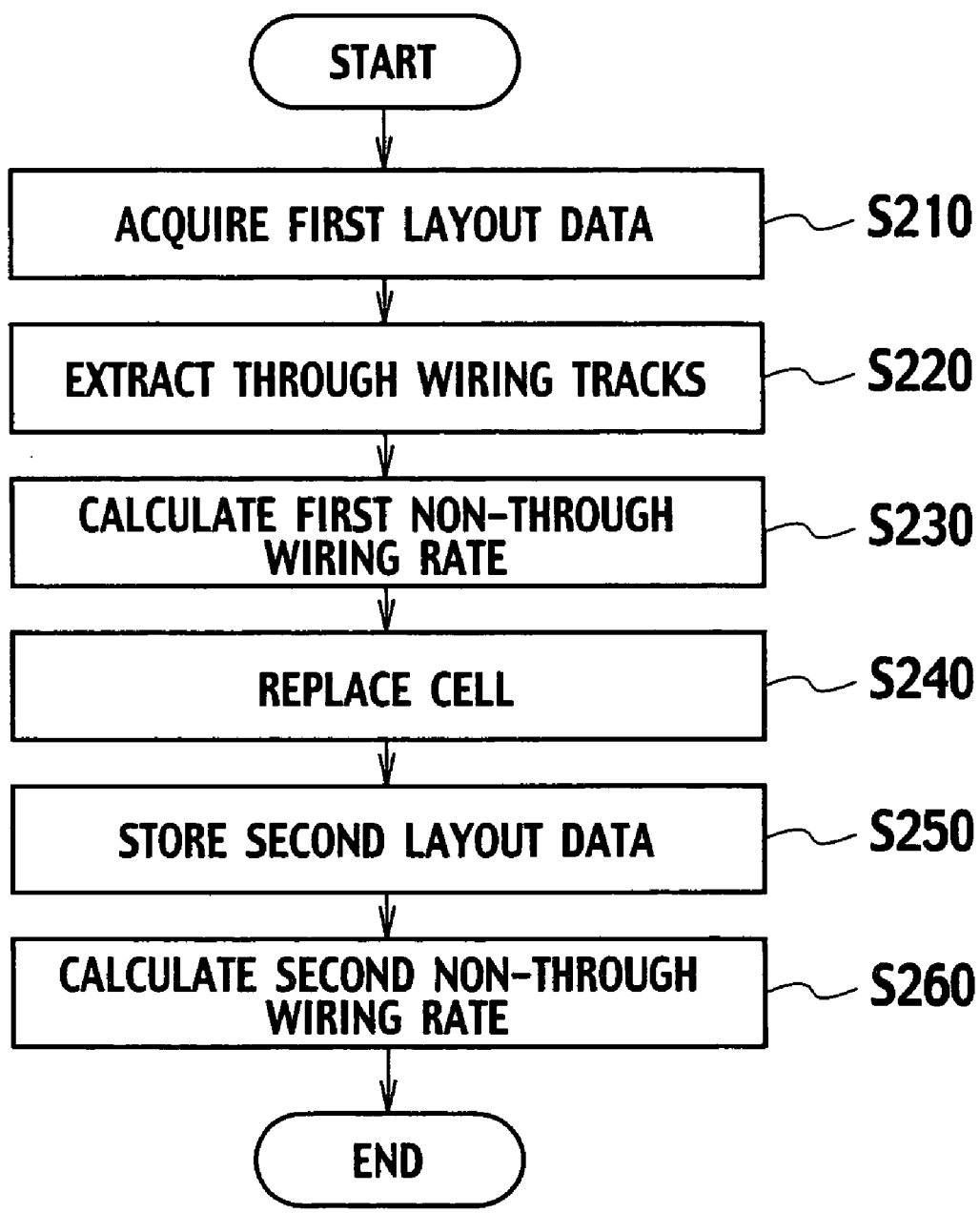
FIG. 5 is a flowchart explaining a method for designing a semiconductor integrated circuit according to the first embodiment of the present invention.

A method for designing the semiconductor integrated circuit by the semiconductor integrated circuit design system, shown in FIG. 1, is described with the flowchart shown in FIG. 5.

In step S210, first layout data for the semiconductor integrated circuit enters the first layout data area 21 via the input unit 50 shown in FIG. 1 and is then stored therein. Here, the first layout data is layout data generated through automatic cell arrangement based on a netlist generated using only the area priority cells.

In step S220, the calculator 13 reads the first layout data from the first layout data area 21. The calculator 13 extracts through wiring tracks for each of the area priority cells included in the first layout data and the yield priority cells having the same functionality and characteristics as the area priority cells based on cell information of the area priority cells stored in the area priority cell library 30 and cell information of the yield priority cells stored in the yield priority cell library 40. The method for extracting through wiring tracks may be the method described with reference to FIG. 2. Information of extracted through wiring tracks is stored in the through wiring track information area 22.

In step S230, the calculator 13 reads the first layout data from the first layout data area 21 and the information of through wiring tracks from the through wiring track information area 22. The calculator 13 calculates a first non-through wiring rate R1 using the method described with reference to FIG. 3, based on the first layout data and the information of through wiring tracks. The first non-through wiring rate R1 denotes a non-through wiring rate for the semiconductor integrated circuit in which only the area priority cells are deployed. The calculated first non-through wiring rate R1 is stored in the non-through wiring rate area 23.

In step S240, the layout data generator 12 reads the first layout data from the first layout data area 21. The layout data generator 12 replaces the area priority cells with the yield priority cells using the method described with reference to FIG. 4.

In step S250, the second layout data generated from the first layout data by replacing the area priority cells with the yield priority cells are stored in the second layout data area 26. The second layout data may be read as an electronic file or the like from the design system shown in FIG. 1 via the output unit 60. The second layout data may be used for generating a photolithography mask or a reticle to be used in manufacturing the semiconductor integrated circuit.

In step S260, the calculator 13 reads the second layout data from the second layout data area 26 and the information of through wiring tracks from the through wiring track information area 22. The calculator 13 calculates a second non-through wiring rate R2 using the method described with reference to FIG. 3, based on the second layout data and the information of through wiring tracks. The second non-through wiring rate R2 denotes a non-through wiring rate for the semiconductor integrated circuit after the area priority cells are replaced with the yield priority cells. The calculated second non-through wiring rate R2 is stored in the non-through wiring rate area 23. The first non-through wiring rate R1 and the second non-through wiring rate R2 stored in the non-through wiring rate area 23 may be supplied from the design system via the output unit 60.

As described above, a semiconductor integrated circuit can be provided by the design system shown in FIG. 1. Therein, the first non-through wiring rate R1 for the semiconductor integrated circuit in which only the area priority cells are deployed and the second non-through wiring rate R2 for the semiconductor integrated circuit after the area priority cells are replaced with the yield priority cells may be determined. Therefore, through comparison of the first non-through wiring rate R1 and the second non-through wiring rate R2, change in the non-through wiring rate due to replacement of the are priority cells with the yield priority cells may be determined. In addition, the designers of the semiconductor integrated circuit may investigate countermeasures in response to the change in the non-through wiring rate.

For example, in the case where the non-through wiring rate increases and the connectibility decreases enough that wiring the semiconductor integrated circuit is difficult, a countermeasure of replacing the yield priority cells with the area priority cells in a region estimated with wiring congestion or the like may be adopted. Replacing the yield priority cells with the area priority cells may increase wiring tracks on which wiring can be deployed. Therefore, wiring congestion is alleviated and the degree of freedom of wiring increased. As a result, according to the semiconductor integrated circuit design system of the first embodiment of the present invention, decrease in connectibility is controlled and yield of the semiconductor integrated circuit is improved.

Second Embodiment

Figure 6:
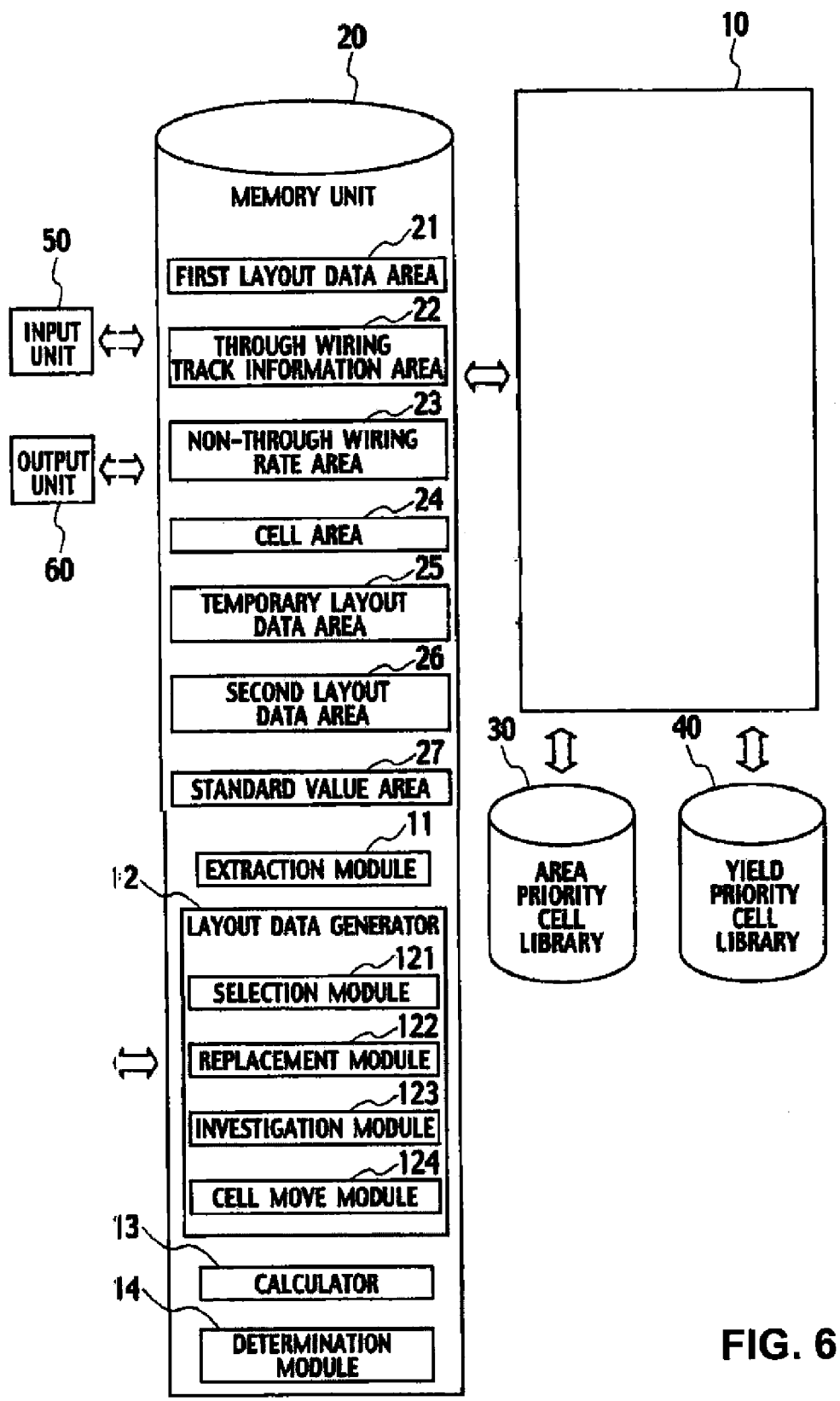
FIG. 6 shows a schematic structure of a system for designing a semiconductor integrated circuit according to a second embodiment of the present invention.

A semiconductor integrated circuit design system according to a second embodiment of the present invention differs from that shown in the FIG. 1 in that it further includes a determination module 14, as shown in FIG. 6. The determination module 14 determines whether or not the second non-through wiring rate R2 satisfies a standard value, which is set so that wiring layout of the semiconductor integrated circuit is possible. The standard value may be set arbitrarily. For example, a non-through wiring rate, by which wiring of the semiconductor integrated circuit according to prior design information for the semiconductor integrated circuit is difficult due to a decrease in connectibility, may be set as the standard value. In the case where the non-through wiring rate is less than the standard value, the determination module 14 determines that the second non-through wiring rate R2 satisfies the standard value. The set standard value is stored in a standard value area 27. Other elements are the same as the first embodiment shown in the FIG. 1.

Figure 7:
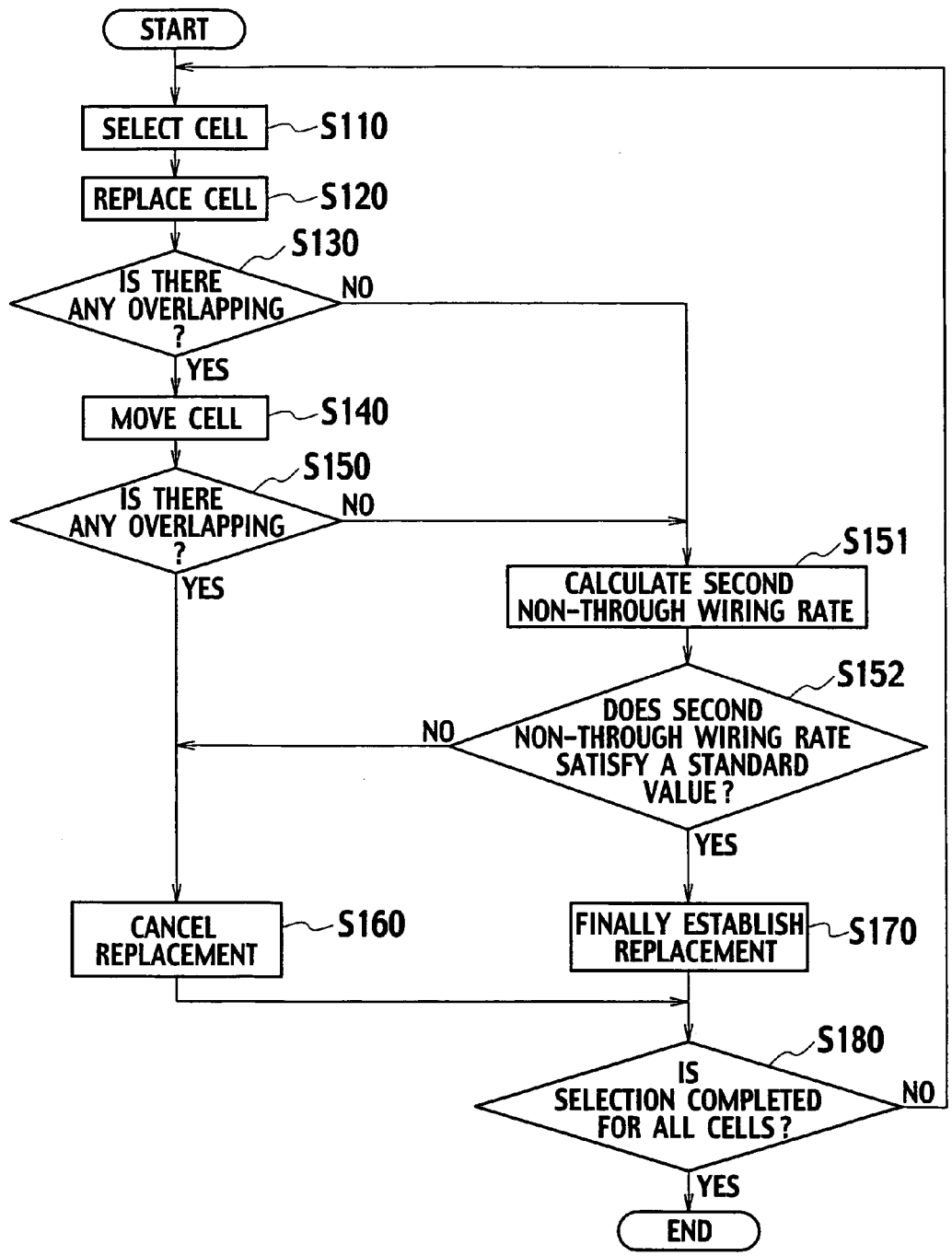
FIG. 7 is a flowchart explaining a method for replacing cells according to the second embodiment of the present invention.

An exemplary method of replacing cells while determining whether or not the second non-through wiring rate R2 satisfies the standard value by using the design system, shown in the FIG. 6, is described with reference to the flowchart of FIG. 7.

In the steps S110 through S130, investigation of whether or not there is overlapping of cells is carried out in the same manner as described with reference to FIG. 4. In other words, an area priority cell is selected from among a plurality of area priority cells included in the first layout data. The area priority cell is replaced with a yield priority cell, and is then investigated as to whether or not there is overlapping of the replaced yield priority cell with an adjacent cell. If the cells are not overlapping, processing proceeds to step S151. Otherwise, if the cells are overlapping, processing proceeds to the step S140.

In the steps S140 through S150, a cell is moved to resolve the overlapping of the cells in the same manner as described with reference to FIG. 4. If the cells are not overlapping, processing then proceeds to the step S151. Otherwise, if there is overlapping of the cells, processing proceeds to the step S160, and the cell replacement and movement in the respective steps S120 and S140 are canceled. Processing then proceeds to the step S180.

In the step S151, the calculator 13 of FIG. 6 reads temporary layout data from the temporary layout data area 25 and information of through wiring tracks from the through wiring track information area 22. The calculator 13 calculates a second non-through wiring rate R2 using the method described with reference to FIG. 3, based on the temporary layout data and the information of through wiring tracks. The calculated second non-through wiring rate R2 is stored in the non-through wiring rate area 23.

In step S152, the determination module 14 reads the standard value from the standard value area 27 and the second non-through wiring rate R2 from the non-through wiring rate area 23. The determination module 14 determines whether or not the second non-through wiring rate R2 satisfies the standard value. If the second non-through wiring rate R2 satisfies the standard value, processing proceeds to the step S170, and the cell replacement and movement in the respective steps S120 and S140 is finally established. The temporary layout data, in which the cell movement is reflected, is stored as the first layout data in the first layout data area 21. Otherwise, if the second non-through wiring rate R2 fails to satisfy the standard value, processing proceeds to the step S160, and the cell replacement and movement in the respective steps S120 and S140 is canceled.

In the step S180, the selection module 121 determines whether or not all of the area priority cells have been selected. If there are any unselected area priority cells, processing returns to the step S110. Otherwise, if all the area priority cells have been selected, the first layout data, which has been stored in the first layout data area 21, is stored as the second layout data in the second layout data area 26, thereby completing the processing.

A method for designing the semiconductor integrated circuit by the semiconductor integrated circuit design system, shown in FIG. 6, is described with reference to the flowchart shown in FIG. 8.

In step S205, a standard value for the second non-through wiring rate R2 enters the standard value area 27 via the input unit 50 shown in FIG. 6 and is then stored therein.

In the steps S210 through S230, a first non-through wiring rate R1 is calculated in the same manner as described with reference to FIG. 5. In other words, the first layout data for the semiconductor integrated circuit is acquired, and respective through wiring tracks for the area priority cells and the yield priority cells having the same functionality and characteristics as the area priority cells are extracted. The first non-through wiring rate R1 is calculated based on the first layout data and the information of through wiring tracks.

In step S241, as described with reference to FIG. 7, the area priority cells are replaced with the yield priority cells while determining whether or not the second non-through wiring rate R2 satisfies the standard value. In step S250, the second layout data after cell replacement is stored in the second layout data area 26.

Although an example of setting a standard value for the second non-through wiring rate R2 has been described above, a standard value may alternatively be set for the difference between the first non-through wiring rate R1 and the second non-through wiring rate R2. In other words, in the case where there is an increase in the rate from the first non-through wiring rate R1 to the second non-through wiring rate R2 that is greater than a predetermined rate of increase, connectibility decreases due to cell replacement, and thereby it is determined that wiring of the semiconductor integrated circuit is impossible.

With the semiconductor integrated circuit design system according to the second embodiment of the present invention, the area priority cells are replaced with the yield priority cells so that the second non-through wiring rate R2 satisfies a standard value. Therefore, the second layout data stored in the second layout data area 26 allows wiring of the semiconductor integrated circuit. Accordingly, the second layout data, which is automatically designed by the semiconductor integrated circuit design system shown in FIG. 6, does not need any countermeasure consideration based on the second non-through wiring rate R2 any more. As a result, the time required for designing the semiconductor integrated circuit may be decreased. The other characteristics of the second embodiment are effectively the same as the first embodiment, and thus repetitive description thereof is omitted.

Third Embodiment

Figure 9:
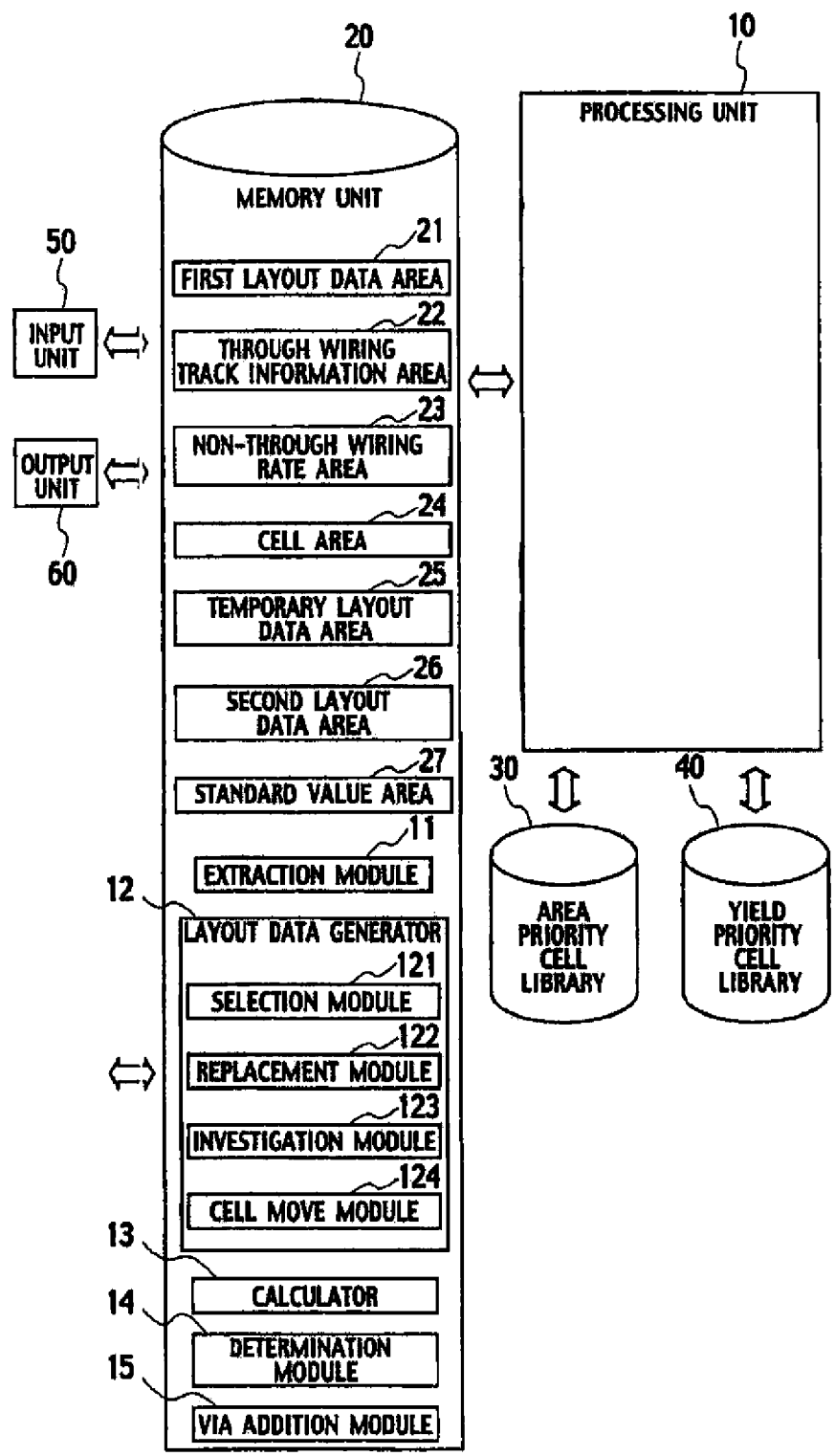
FIG. 9 shows a schematic structure of a system for designing a semiconductor integrated circuit according to a third embodiment of the present invention.

A semiconductor integrated circuit design system according to a third embodiment of the present invention differs from the design system shown in FIG. 6 in that it further includes a via addition module 15, as shown in FIG. 9. Other elements are the same as the second embodiment shown in FIG. 6. In general, a plurality of vias are arranged in the terminal regions of the respective yield priority cells. However, there are cases where a single via may be arranged in a terminal region, since the size of yield priority cells in which a plurality of vias are arranged in all terminal regions becomes extremely large. In this case, connectibility may decrease remarkably. In the case where there is a yield priority cell having a terminal region in which a single via is arranged, the via addition module 15 adds a via to the terminal region. When the cell to be processed has a plurality of terminal cells, the via addition module 15 selects the terminal regions in turn, adding a via to the respective selected terminal regions.

An exemplary method for adding a via to respective terminal regions of a yield priority cell by the design system, shown in FIG. 9, is described with reference to the flowchart of FIG. 10. A case of the via addition module 15 adding a via to a cell 150 shown in FIG. 11 is exemplified in the following description. Power supply line regions 301 and 302 shown in FIG. 11 are regions in which power supply lines for the semiconductor integrated circuit are to be deployed. Wiring tracks 201a through 201h and wiring tracks 250a through 250e pass through the cell 150. As shown in FIG. 11, the through wiring tracks of the cell 150 are the wiring tracks 201*b*, 201*e*, and 201*g*. The cell 150 has terminal regions 151, 152, and 153. The terminal region 151 includes a first region 1511, a second region 1512, and a via 1513. The first region 1511 is arranged in a first metalization layer. The second region 1512 is arranged in a second metalization layer. The second metalization layer is above the first metalization layer. The first regions 1511 and the second region 1512 are electrically connected by the via 1513. The terminal region 152 includes a first region 1521 arranged in the first metalization layer, a second region 1522 arranged in the second metalization layer, and vias 1523*a* and 1523*b* connecting the first region 1521 and the second region 1522. The terminal region 153 includes a first region 1531 arranged in the first metalization layer, a second region 1532 arranged in the second metalization layer, and a via 1533 connecting the first region 1531 and the second region 1532. Note that in FIG. 11, the first metalization layer and the vias arranged below the second metalization layer are viewed through the second metalization layer.

Figure 10:
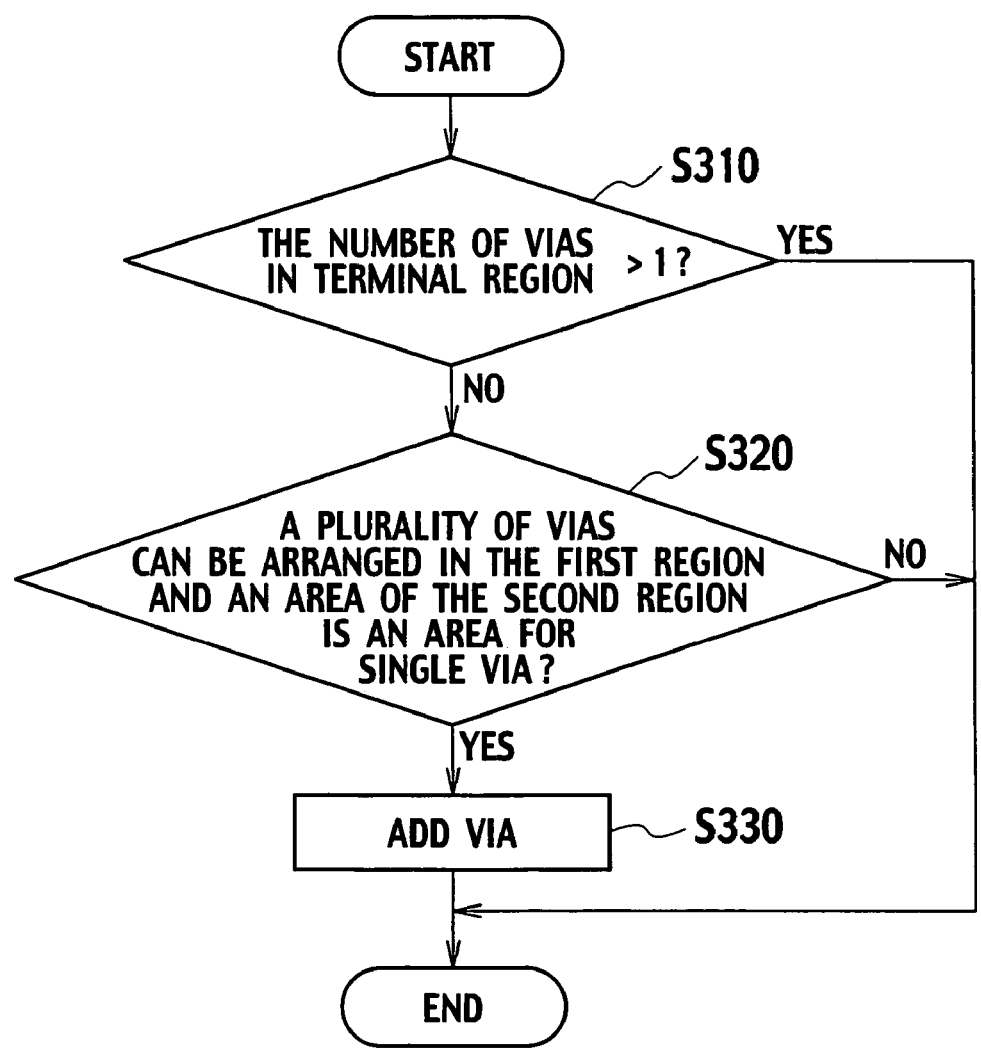
FIG. 10 is a flowchart explaining a method for adding a cell according to the third embodiment of the present invention.
Figure 11:
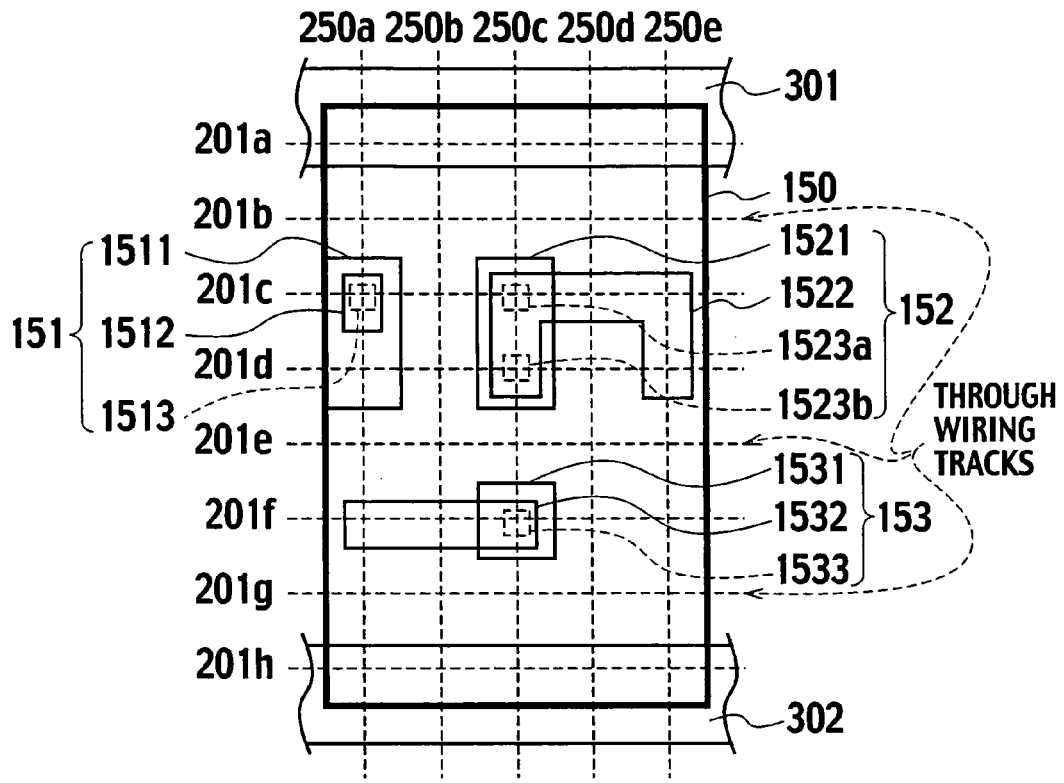
FIG. 11 shows an example of a cell used to explain a method for adding a cell according to the third embodiment of the present invention

In step S310 of FIG. 10, the via addition module 15 extracts the number of vias arranged in each of the terminal regions of the cell to be processed. When a plurality of vias are arranged in a terminal region, processing is completed. For example, in the case of processing the cell 150 shown in FIG. 11, the number of vias arranged in each of the terminal regions 151 through 153 is extracted. Since the vias 1523*a* and 1523*b* are arranged in the terminal region 152, processing for the terminal region 152 is completed. In the case of the terminal regions 151 and 153 in which a single via is respectively arranged, processing proceeds to step S320.

In the step S320, the via addition module 15 determines whether or not a plurality of vias can be arranged in the first region of a terminal region to be processed and the area of the second region is equivalent to the area of a single via. For example, the area of the first region 1511 of the terminal region 151 shown in FIG. 11 is large enough to accommodate two vias. Furthermore, the area of the second region 1512 of the terminal region 151 is large enough to accommodate a single via. In this case, processing then proceeds to step S330. On the other hand, the area of the first region 1531 of the terminal region 153 is not large enough to accommodate two vias. In such case, processing is completed.

Figure 12:
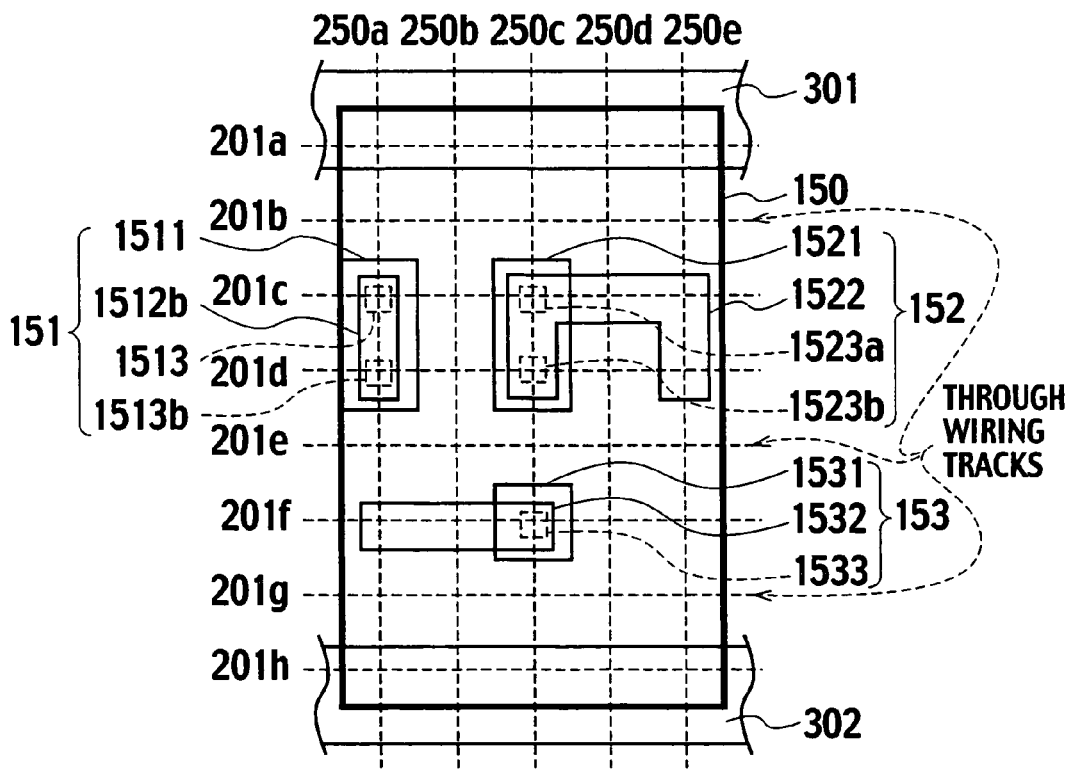
FIG. 12 shows an example of a cell used to explain a method for adding a cell according to the third embodiment of the present invention

In the step S330, the via addition module 15 increases the area of the second region of the terminal region to be processed and adds a via to electrically connect the first region and the second region. An example where the second region 1512 of the terminal region 151 of FIG. 11 is increased and a new second region 1512*b* is set is shown in FIG. 12. The second region 1512*b* has a newly added via 1513*b*. However, in general, addition of a via may reduce the number of through wiring tracks.

As shown in FIG. 12, through wiring tracks of the cell 150 are identified as 201*b*, 201*e*, and 201*g*. In other words, the number of through wiring tracks does not decrease as a result of the addition of the via.

Addition of vias using the method described above reduces the fracture defects of the cell 150 caused by a connection defect between the first metalization layer and the second metalization layer. Note that in the above description, the area of the first region is large enough to accommodate two or more vias and the area of the second region is large enough to accommodate only one via; however, vias may be added in the same manner in the reverse case where the area of the second region is large enough to accommodate two or more vias and the area of the first region is large enough to accommodate only a single via. Furthermore, vias may be added in the case where the areas of the first region and the second region are large enough to accommodate two or more vias but in which only a single via is arranged.

Figure 13:
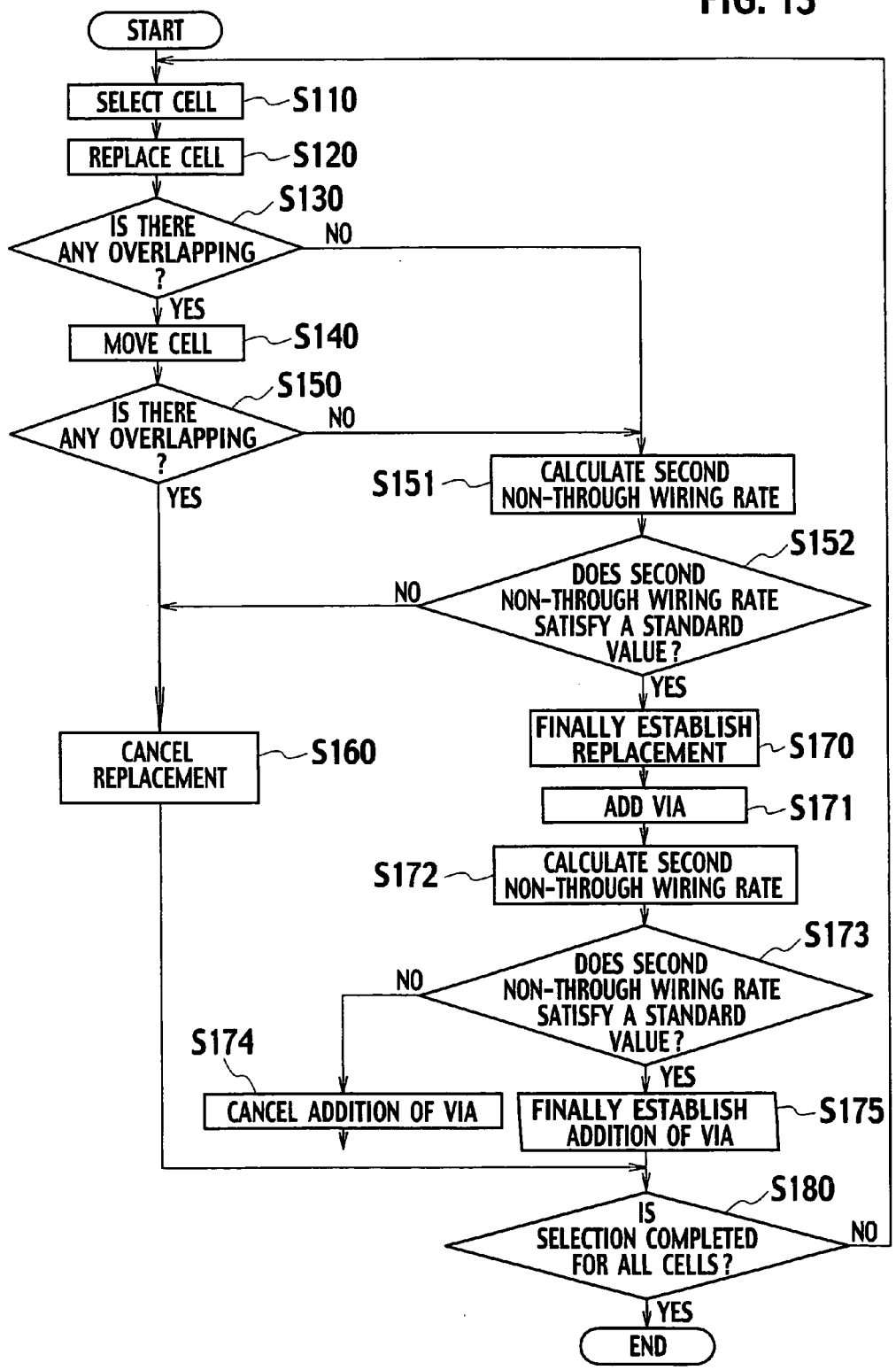
FIG. 13 is a flowchart explaining a method for replacing cells according to the third embodiment of the present invention.

An exemplary method for replacing a cell while a via is added to a terminal region of a yield priority cell by the design system, shown in FIG. 9, is described with reference to the flowchart of FIG. 13.

In the steps S110 through S152, it is determined whether or not a second non-through wiring rate R2 satisfies a standard value in the same manner as described with reference to FIG. 7. In other words, an area priority cell is selected from among a plurality of area priority cells included in first layout data. It is then determined whether or not the second non-through wiring rate R2 satisfies the standard value based on temporary layout data after the area priority cells are replaced with the yield priority cells. If the second non-through wiring rate R2 satisfies the standard value, processing proceeds to the step S170, and the cell replacement and movement in the respective steps S120 and S140 is finalized. Processing then proceeds to step S171. Otherwise, if the second non-through wiring rate R2 fails to satisfy the standard value, processing proceeds to the step S160, and the cell replacement and movement in the respective steps S120 and S140 is canceled. Processing then proceeds to the step S180.

In the step S171, the via addition module 15 reads the temporary layout data from the temporary layout data area 25. The via addition module 15 adds a via to the terminal regions of the yield priority cell replaced in the step S120 and generates temporary layout data in which the via addition is reflected by the method described with reference to FIG. 10. The generated temporary layout data is stored in the temporary layout data area 25.

In step S172, the calculator 13 reads the temporary layout data from the temporary layout data area 25 and information of through wiring tracks from the through wiring track information area 22. The calculator 13 calculates a second non-through wiring rate R2 using the method, which is described with reference to FIG. 3, based on the temporary layout data and the information of through wiring tracks. The calculated second non-through wiring rate R2 is stored in the non-through wiring rate area 23.

In step S173, the determination module 14 reads the standard value from the standard value area 27 and the second non-through wiring rate R2 from the non-through wiring rate area 23. The determination module 14 determines whether or not the second non-through wiring rate R2 satisfies the standard value. If the second non-through wiring rate R2 satisfies the standard value, processing proceeds to step S175, and the via addition in the step S171 is finalized. The temporary layout data is stored as the first layout data in the first layout data area 21. Processing proceeds to the step S180. Otherwise if the second non-through wiring rate R2 fails to satisfy the standard value, processing proceeds to step S174, and the via addition in the step S120 is canceled. Processing proceeds to the step S180.

In the step S180, the selection module 121 determines whether or not all of the area priority cells have been selected. If there are any unselected area priority cells, processing returns to the step S110. Otherwise, if all of the area priority cells have been selected, processing is completed.

Figure 14:
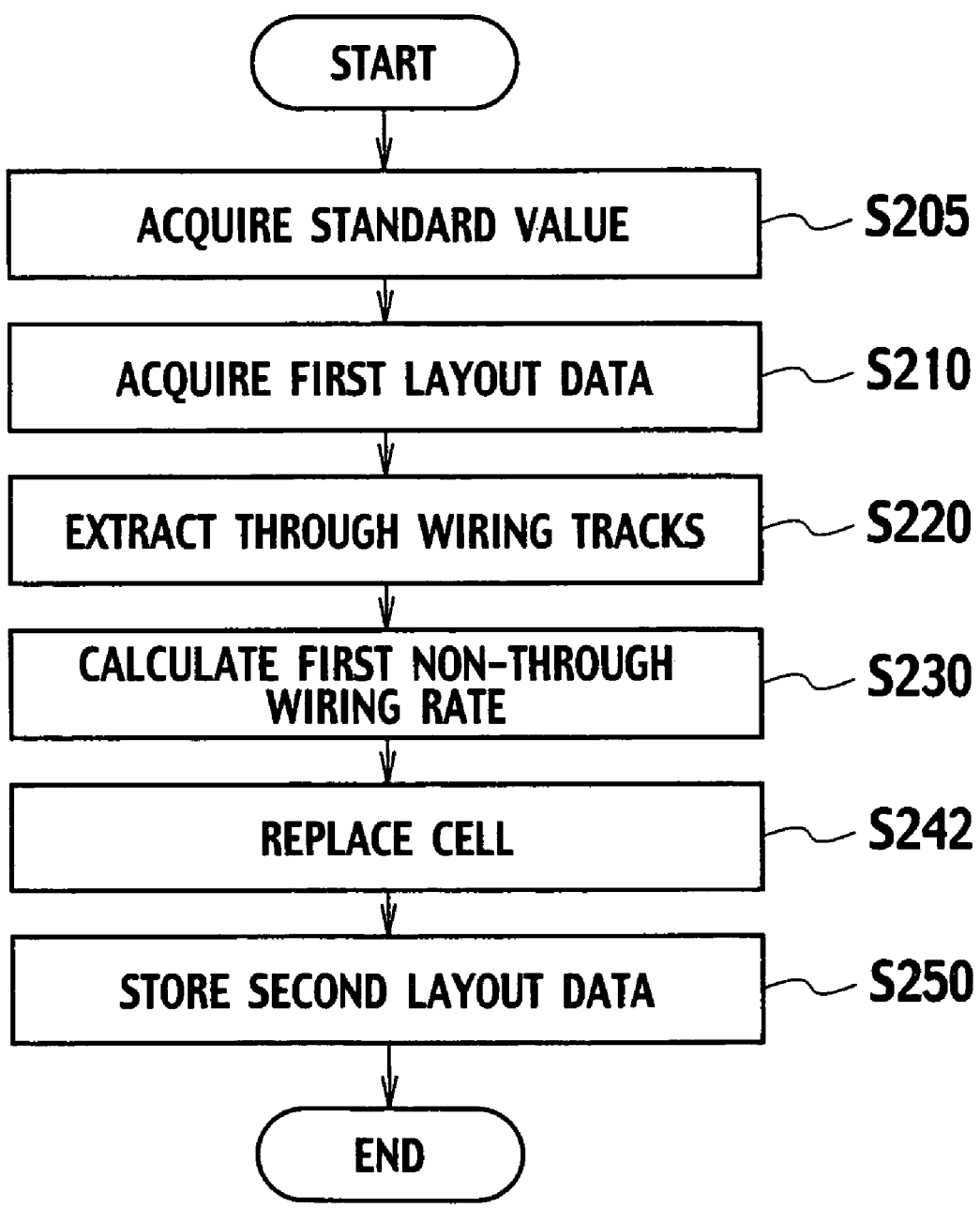
FIG. 14 is a flowchart explaining a method for designing a semiconductor integrated circuit according to the third embodiment of the present invention.

A method for designing the semiconductor integrated circuit by the semiconductor integrated circuit design system, shown in FIG. 9, is described with reference to the flowchart shown in FIG. 14.

Figure 8:
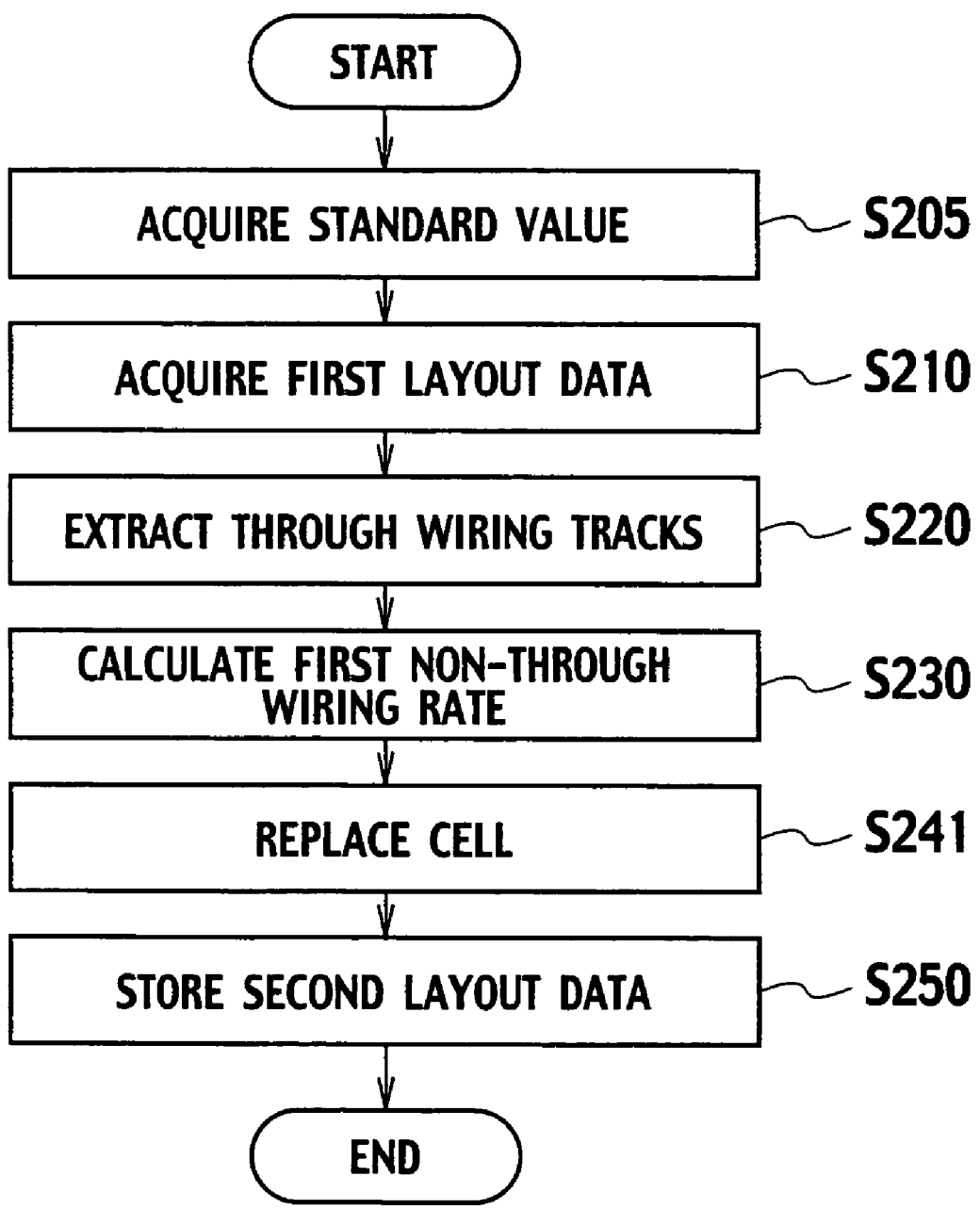
FIG. 8 is a flowchart explaining a method for designing a semiconductor integrated circuit according to the second embodiment of the present invention.

In the step S205 of FIG. 8, the standard value for the second non-through wiring rate R2 enters the standard value area 27 via the input unit 50 shown in FIG. 9 and is then stored therein.

In the steps S210 through S230, a first non-through wiring rate R1 is calculated in the same manner as described with reference to FIG. 8. In other words, the first layout data for the semiconductor integrated circuit is acquired, and respective through wiring tracks for the area priority cells and the yield priority cells having the same functionality and characteristics as the area priority cells are extracted. The first non-through wiring rate R1 is then calculated based on the first layout data and the information of through wiring tracks.

In step S242, the area priority cells are replaced with the yield priority cells. At this time, as described with reference to FIG. 13, vias are added while determining whether or not the second non-through wiring rate R2 satisfies the standard value. In step S250, the second layout data after cell replacement is then stored in the second layout data area 26.

With the semiconductor integrated circuit design system according to the third embodiment of the present invention, vias are added to the yield priority cells so that the second non-through wiring rate R2 satisfies the standard value. Therefore, the second layout data stored in the second layout data area 26 denotes layout data that allows wiring of the semiconductor integrated circuit. Furthermore, vias are added in the case where the area of the first region is large enough to accommodate a plurality of vias. Therefore, vias are added without increasing the area of the yield priority cells. As a result, yield of the semiconductor integrated circuit is improved without increasing the area thereof. The remainder of the description of the third embodiment is effectively the same as the second embodiment, and thus repetitive description thereof is omitted.

Other Embodiments

The above-described calculating method for the non-through wiring rate in the description of the first through the third embodiment is merely an example, and a non-through wiring rate may be calculated for each of a plurality of divided regions instead of for the entire cell-arranged region.

Various modifications will become possible for those skilled in the art after receiving the teachings of the present disclosure without departing from the scope thereof.

What is claimed is:

1. A computer implemented method for designing a semiconductor integrated circuit, comprising:
    extracting through wiring tracks that linearly pass through horizontally each of area priority cells, which are included in a first layout data and designed to reduce the area thereof, and yield priority cells designed to increase yield from horizontal wiring tracks;
    generating second layout data from the first layout data by replacing the area priority cells with the yield priority cells;
    investigating an overlap between the yield priority cell which replaced the area priority cell and a cell adjacent to the yield priority cell;
    moving at least one of the yield priority cells and an adjacent cell to resolve the overlap when the overlap occurs; and
    calculating a ratio of a number of intersections between the horizontal wiring tracks and vertical wiring tracks at which through wiring cannot be laid to a number of all of the intersections defined in semiconductor integrated circuit, based on the second layout data and information of the through wiring tracks, the through wiring linearly passing through the yield priority cell and the area priority cell without overlapping a terminal region that electrically connects any of the yield priority cell and the area priority cell to wirings; wherein the ratio is provided for storage or output.

2. The method of claim 1, wherein the number of intersections at which the through wirings cannot be deployed is the number of intersections on the through wiring tracks pass, which can not linearly pass through mutually adjacent cells.

3. The method of claim 1, further comprising: determining whether the ratio satisfies a standard value, the standard value is set so that a wiring layout of the semiconductor integrated circuit is possible.

4. The method of claim 3, wherein determining whether the ratio satisfies the standard value each time the area priority cell is replaced with the yield priority cell.

5. The method of claim 1, further comprising: adding a via to the yield priority cell.

6. The method of claim 5, wherein adding a via to a terminal region, which is included in the yield priority cell and connects wirings arranged in different metallization layers, when there is only a signal via arranged in the terminal region.

7. A computer program product comprising instructions stored in a computer readable storage device, which when executed by a computer, perform steps for designing a semiconductor integrated circuit, the steps comprising:
    extracting through wiring tracks that linearly pass through horizontally each of area priority cells, which are included in a first layout data and designed to reduce the area thereof, and yield priority cells designed to increase yield from horizontal wiring tracks;
    generating second layout data from the first layout data by replacing the area priority cells with the yield priority cells; and
    calculating a ratio of the number of intersections between the horizontal wiring tracks and vertical wiring tracks at which through wiring cannot be laid to the number of all of the intersections defined in the semiconductor integrated circuit, based on the second layout data and information of the through wiring tracks, the through wiring linearly passing through the yield priority cell and the area priority cell without overlapping with the terminal region which electrically connects any of the yield priority cell and the area priority cell to wirings.

8. The computer program product of claim 7, wherein the number of intersections at which the through wirings cannot be deployed is the number of intersections on the through wiring tracks, which can not linearly pass through mutually adjacent cells.

9. The computer program product of claim 7, the steps further comprising:
    determining whether the ratio satisfies a standard value, the standard value is set so that a wiring layout of the semiconductor integrated circuit is possible.

10. The computer program product of claim 9, wherein determining whether the ratio satisfies the standard value each time the area priority cell is replaced with the yield priority cell.

11. The computer program product of claim 7, the steps further comprising:
    adding a via to the yield priority cell.

12. The computer program product of claim 11, wherein adding a via to a terminal region, which is included in the yield priority cell and connects wirings arranged in different metallization layers, when there is only a signal via arranged in the terminal region.

* * * * *